US007276696B2

(12) United States Patent
Remillard et al.

(10) Patent No.: US 7,276,696 B2
(45) Date of Patent: *Oct. 2, 2007

(54) ACTIVE NIGHT VISION THERMAL CONTROL SYSTEM USING WAVELENGTH-TEMPERATURE CHARACTERISTIC OF LIGHT SOURCE

(75) Inventors: Jeffrey Remillard, Ypsilanti, MI (US); Kenneth Nietering, Dearborn, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 9 days.

This patent is subject to a terminal disclaimer.

(21) Appl. No.: 11/164,550

(22) Filed: Nov. 29, 2005

(65) Prior Publication Data

US 2007/0200064 A1 Aug. 30, 2007

Related U.S. Application Data

(63) Continuation-in-part of application No. 10/604,376, filed on Jul. 15, 2003, now Pat. No. 6,969,855.

(51) Int. Cl.
*G02F 1/01* (2006.01)
(52) U.S. Cl. .................................... 250/330
(58) Field of Classification Search ............... 250/330, 250/338.1, 339.03, 339.04, 495.1
See application file for complete search history.

(56) References Cited

U.S. PATENT DOCUMENTS

| 3,751,166 | A | 8/1973 | Starkey et al. |
| 4,103,174 | A * | 7/1978 | McClatchie et al. ...... 250/493.1 |
| 5,247,185 | A * | 9/1993 | Herrera et al. .......... 250/504 R |
| 5,482,013 | A | 1/1996 | Andrews et al. |
| 6,188,189 | B1 | 2/2001 | Blake |
| 6,603,507 | B1 | 8/2003 | Jiang et al. |
| 6,795,237 | B1 | 9/2004 | Marinelli et al. |
| 2006/0171704 | A1* | 8/2006 | Bingle et al. ................ 396/419 |

OTHER PUBLICATIONS

U.S. Appl. No. 10/250,062, filed Jun. 2, 2003, Marinelli et al.

* cited by examiner

*Primary Examiner*—David Porta
*Assistant Examiner*—Marcus Taningco
(74) *Attorney, Agent, or Firm*—Frank MacKenzie; Dickinson Wright PLLC

(57) ABSTRACT

A thermal control system (11) for a light source (46) of a vision system (10) includes a heater (63) that is thermally coupled to the light source (46). A thermal sensor (60) is thermally coupled to the light source (46) and generates a temperature signal. A controller (50) is coupled to the heater (63) and to the thermal sensor (60). The controller (50) operates the heater (63) when the temperature signal is below a maximum temperature limit. The minimum temperature limit corresponds to the wavelength-temperature characteristic of the light source.

11 Claims, 3 Drawing Sheets

ACTIVE NIGHT VISION THERMAL CONTROL SYSTEM USING WAVELENGTH-TEMPERATURE CHARACTERISTIC OF LIGHT SOURCE

CROSS REFERENCE TO RELATED APPLICATION(S)

The present application is a Continuation-In-Part of U.S. patent application Ser. No. 10/604,376 filed Jul. 15, 2003 now U.S. Pat. No. 6,969,588.

TECHNICAL FIELD

The present invention relates to night vision systems, and more particularly, to a system and method of thermally controlling operating range of a light source of an active night vision system using the wavelength-temperature characteristic of the light source.

BACKGROUND OF THE INVENTION

Night vision systems allow a vehicle occupant to better see objects during relatively low visible light level conditions, such as at nighttime. Night vision systems typically are classified as either passive night vision systems or active night vision systems. Passive systems simply detect ambient infrared light emitted from objects within a particular environment. Active systems utilize a light source to illuminate a target area and subsequently detect infrared light reflected off objects within that area.

Passive systems typically use far-infrared cameras characterized by low resolution and a relatively narrow field-of-view. Such cameras must be located on the vehicle exterior in order to acquire requisite infrared energy in the operating environment. Externally mounted cameras can negatively affect vehicle styling. Far-infrared cameras are also costly to manufacture and generate images that have poor contrast, which can be difficult to interpret.

Active systems provide improved resolution and image clarity over passive systems. Active systems utilize laser or incandescent light sources to generate an illumination beam having near infrared light energy, and charged coupled devices (CCD) or complementary-metal-oxide-semiconductor (CMOS) cameras to detect reflected infrared light. Active systems commonly deploy a light source external to the vehicle so as to transmit a significant amount of light energy and provide a bright scene for imaging.

Diode lasers are preferred over incandescent light sources for several reasons. Incandescent light sources are not monochromatic like diode lasers, but instead emit energy across a large spectrum, which must be filtered to prevent glare onto oncoming vehicles. Filtering a significant portion of energy from a bulb is expensive, energy inefficient, and generates undesired thermal energy. Also, filter positioning is limited in incandescent applications, since the filter must be located proximate an associated light source. As well, multiple incandescent sources are often required to provide requisite illumination, thus increasing complexity and costs.

Exterior mounted light sources or cameras are undesirable due to risk of damage during a vehicle collision. Night vision components are relatively expensive and, as a result, protection of the components is desired. Also, exterior mounted light sources and cameras are susceptible to theft. Additionally, external mounting of sources and cameras can limit and compromise vehicle design and styling, can be esthetically displeasing, and can increase exposure of the devices to dust and debris. Exposure to dust and debris negatively effects performance of the sources and cameras. When the sources and cameras are dirty, light transmission and reception can be substantially reduced, and compromise system performance.

Exterior mounted semiconductor illumination sources have additional associated disadvantages. A significant disadvantage is controlling the wavelength of the illumination beam. Night vision systems have a preferred wavelength operating range. When a night vision system is operated outside this range the received illumination decreases negatively, affecting image quality of the night vision system. The diode laser emission wavelength is sensitive to change in temperature, such that the wavelength of a diode laser output shifts approximately 0.25 nm for every one-degree Celsius temperature change. Since external temperatures vary considerably, it is difficult to control the temperature of a diode laser. Also, when mounted externally, a risk of exposure to water exists, which can render the laser inoperable. Sealing and housing problems due to thermal energy management may also arise when weatherproofing diode lasers.

Furthermore, in designing a vehicle exterior, the external light source may have to be customized to satisfy styling requirements. Thus it is difficult to achieve commonality for light sources between different vehicles. Designing different light sources for different vehicles is costly.

In the parent application, U.S. patent application Ser. No. 10/604,376, a bandpass filter is used to detect a light reflected from objects in the scene. The bandpass filter is used to remove most of the light from oncoming headlights which prevents the camera image from blooming and enables the system to see into the lights of the opposing vehicles. The system uses a filter having a full-width-at-half-maximum (FWHM) of about 13 nm. This value is relatively high and still allows a substantial amount of light from oncoming headlights to be introduced into the system. The value of the filter is chosen to accommodate the manufacturing tolerances between the various light sources. It would therefore be desirable to provide an approved active night vision system that reduces the filter value substantially below that of 13 nm to allow even more light to be filtered from oncoming headlights.

SUMMARY OF THE INVENTION

The present invention provides a thermal control system for a semiconductor light source of an active night vision system of a vehicle. A thermal control system for a light source of a vision system includes a heater that is thermally coupled to the light source. A thermal sensor is thermally coupled to the light source and generates a temperature signal. A controller is coupled to the heater and to the thermal sensor. The controller operates the heater when the temperature signal is below a maximum temperature limit. The temperature limits are determined as a function of the wavelength temperature curve of the light source.

One of several advantages of the present invention is that it provides a thermal system for a light source of a vision system that maintains a desired operating range of the light source. In so doing, the present invention accurately maintains desired illumination wavelength of the light source thus allowing a narrower filter to be used. The narrower filter allows greater light filtering, and in comparison to a system that uses a wide filter, minimizes or eliminates bloom in regions of the image near the headlamps of oncoming cars.

Another advantage of the present invention is that it is thermally configured as to efficiently adjust temperature of the light source.

Furthermore, the present invention is designed such that it may be utilized within an interior cabin of a vehicle. Interior cabin use allows for easier temperature control of the light source and minimizes risk of exposure to water or condensation on the light source.

Yet another advantage of the present invention is that it provides a thermal control system that is compact in design and may be located in various locations within an interior cabin of a vehicle.

The present invention itself, together with further objects and attendant advantages, will be best understood by reference to the following detailed description, taken in conjunction with the accompanying drawing.

DETAILED DESCRIPTION

Figure 1:
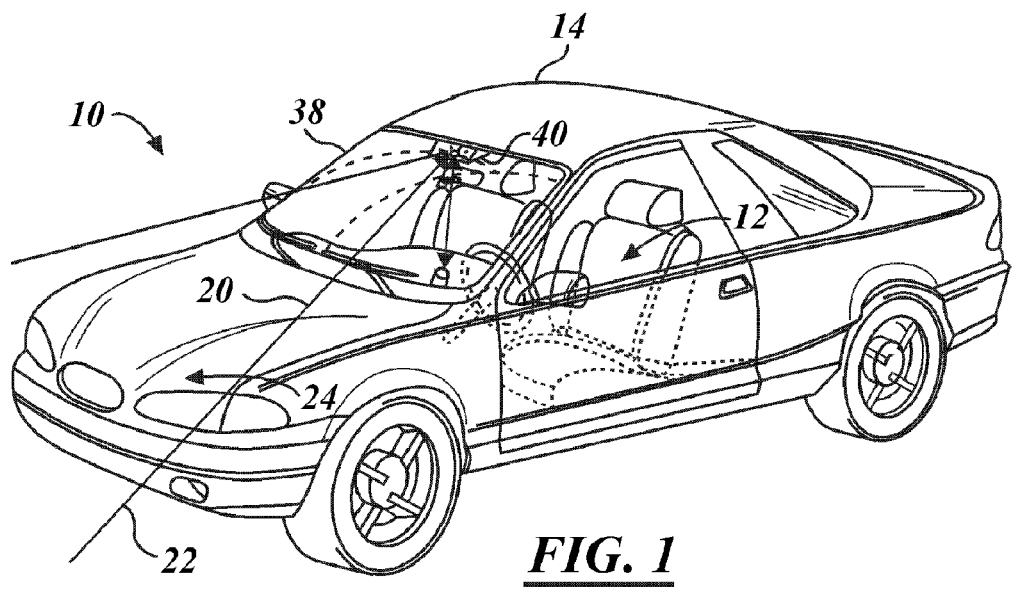
FIG. 1 is a front perspective view of an active night vision system utilizing a thermal control system in accordance with an embodiment of the present invention.

In the following figures the same reference numerals will be used to refer to the same components. While the present invention is described with respect to a system and method of thermally controlling operating range of a light source of an active night vision system, the present invention may be applied in various applications where near infrared imaging is desired, such as in adaptive cruise control applications, collision avoidance and countermeasure systems, and in image processing systems. The present invention may be applied during daytime hours or at night. The present invention may be applied in various types and styles of vehicles as well as in non-vehicle applications.

Also, although the present invention is described with respect an illumination system that is configured to be mounted within an overhead console of a vehicle, the present invention may be applied to light sources within or exterior to an interior cabin of a vehicle, as well as to other light sources.

In the following description, various operating parameters and components are described for one constructed embodiment. These specific parameters and components are included as examples and are not meant to be limiting.

Additionally, in the following description the term "near infrared light" refers to light having wavelengths within the infrared light spectrum (750 nm to 1000 nm) and light having wavelengths near or just outside of the infrared light spectrum. The term also includes at least the spectrum of light output by the particular laser diode source disclosed herein.

Figure 2:
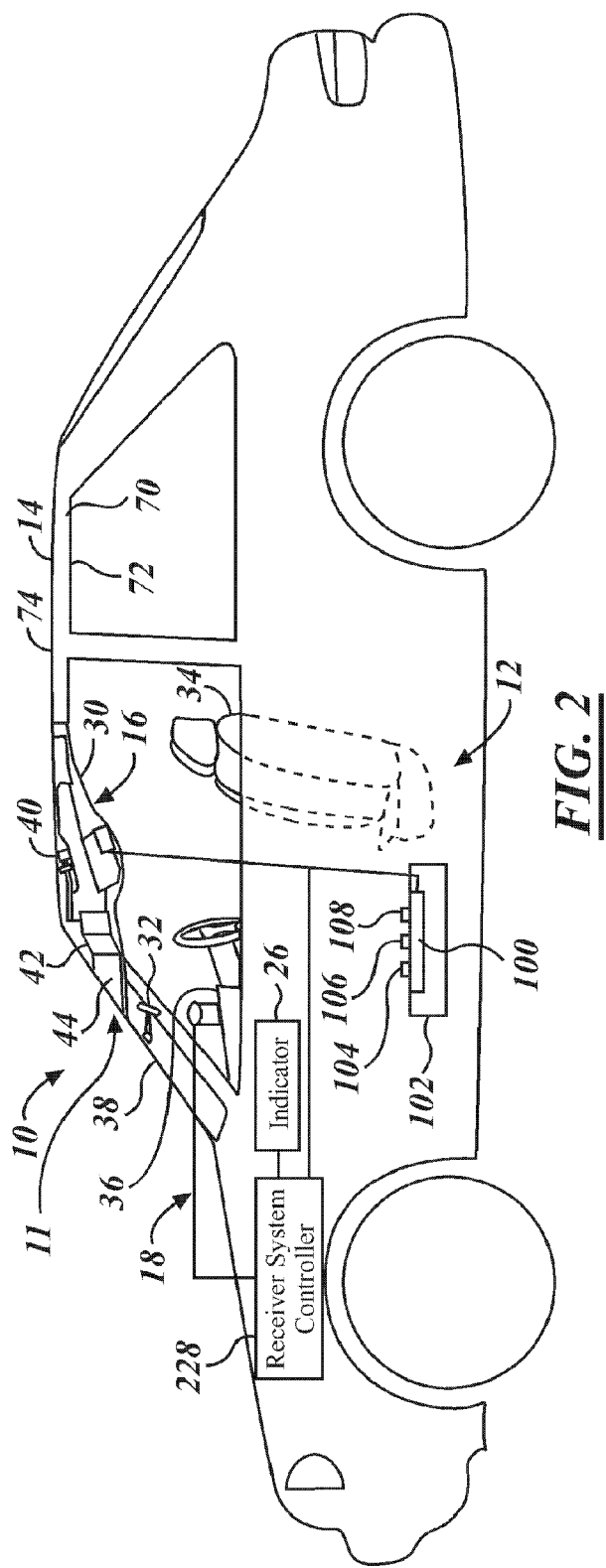
FIG. 2 is a side perspective and block diagrammatic view of the active night vision system utilizing the thermal control system in accordance with an embodiment of the present invention.

Referring now to FIGS. 1 and 2, front and side perspective views of an active night vision system 10 utilizing a thermal control system 11 in accordance with an embodiment of the present invention are shown. The vision system 10 is configured for an interior passenger cabin 12 of a vehicle 14. The vision system 10 includes an illumination system 16 and a receiver system 18. The illumination system 16 generates an illumination beam 20 having a beam pattern 22, which is directed towards a target area 24 that is forward of the vehicle 14. Portions of the illumination beam 20 are reflected off objects (not shown) within the target area 24 and are received by the receiver system 18 having a receiver system controller 228. The receiver system 18 indicates to vehicle occupants, via an indicator 26, detection of the objects in response to reflected portions of the illumination beam 20. The thermal control system 11 thermally controls the operating range of the illumination system 16.

The illumination system 16 is configured to be mounted within an overhead console 30 above a rearview mirror 32, and the receiver system 18 is configured to be mounted forward of a driver seat 34 on a dashboard 36. Of course, the illumination system 16 and receiver system 18 may be mounted in other locations around windshield 38 as well as other window and non-window locations within the vehicle 14.

Figure 3:
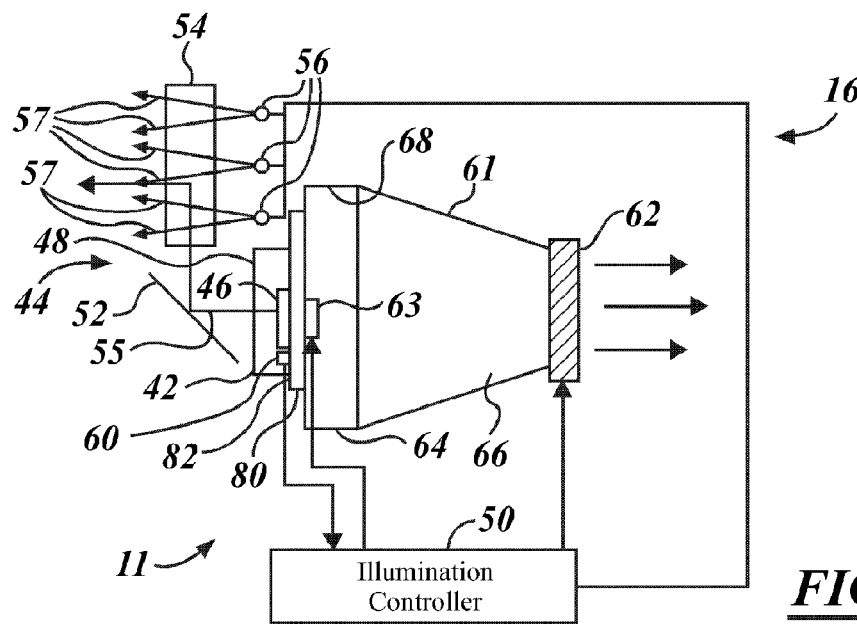
FIG. 3 is a block diagrammatic view of an illuminator system utilizing the thermal control system in accordance with an embodiment of the present invention.

Referring also to FIG. 3, a block diagrammatic view of the illuminator system 16 utilizing the thermal control system 11 in accordance with an embodiment of the present invention is shown. The illumination system 16 includes an illuminator assembly 40 and the thermal control system 11.

The illuminator assembly 40 includes a light source assembly 42 that generates light, which may be emitted from the assembly 42 in the form of an illumination beam, such as beam 20. Light generated from the light assembly 42 is directed through an optic assembly 44 where it is collimated to generate the illumination pattern 22. The illumination beam 20 is emitted from the light assembly 42 and passed through the windshield 38. The light assembly 42 includes a light source 46 that is contained within a light source housing 48. The light source 46 also receives an illumination signal from the illumination controller 50. The intensity of the illumination beam 20 is controlled by the illumination signal.

The light source 46 may be of various type and style. In one embodiment of the present invention the light source 46 is a near infrared diode laser, having desired monochromatic and illumination characteristics. The diode laser may, for example, be a Single Stripe Diode Laser, Model No. S-81-3000-C-200-H manufactured by Coherent, Inc. of Santa Clara, Calif. The light source has a wavelength-temperature characteristic or curve. The characteristic or curve may be provided from the light source manufacturer. The characteristic or curve is measured for each individual light source since this curve has a tendency to vary from one light source to the next due to manufacturing tolerances and the like.

The optical system 44 includes the light assembly 42, a light coupler 52, and a beam-forming optic 54. Light from the light source 46, represented by arrow 55, is emitted towards and is reflected by the light coupler 52 to the optic 54, where it is again reflected towards and through the windshield 38. The light coupler 52 and the optic 54 may be contained within a component alignment maintaining module or housing (not shown). The optical system 44 may also include a series of light emitting diodes (LEDs) 56 or the like for performing color mitigation and for adjusting perceived color of the illumination beam 20 as it is emitted from the illuminator assembly 16. Light emitted by the LEDs 56 is represented by arrows 57.

The light coupler 52 may be in the form of a mirror, as shown, a series of mirrors, a fiber optic cable, or other reflective or light transporting device known in the art. In the embodiment as described, light is emitted from the light source 46 in the form of an elliptically shaped beam with a spread angle of approximately 20-50°, which is then reflected at approximately a 90° angle by the light coupler 52 to enter the optic 54. Although, the present invention is described with respect to the incorporated use of a light coupler 52, the present invention may be modified to have direct emission of light between the light source 46 and the optic 54, without use of a light coupler 52.

Although, the optic 54 may be preferably a thin sheet optical element, it may be in some other form. Continuing from the above-described embodiment, the optic 54 expands and reflects the light generated by the light source 46 at approximately a 90° angle to direct the light forward of the vehicle 14. Light from the light source 46 enters and is reflected and/or collimated by the optic 54, and is then reflected and emitted through the windshield 38. Also, although a single optic is shown, additional optics may be incorporated within the illumination system 16 to form a desired beam pattern onto a target external from the vehicle 14.

The optic 54 may be formed of plastic, acrylic, or of some other similar material known in the art. The optic 54 can utilize the principle of total internal reflection (TIR) and form the desired beam pattern with series of stepped facets; An example of a suitable optical element is disclosed in U.S. patent application Ser. No. 09/688,982 entitled "Thin-Sheet Collimation Optics For Diode Laser Illumination Systems For Use In Night-Vision And Exterior Lighting Applications".

The thermal control system 11 includes a thermal sensor 60, a cooling assembly 61 that has a cooling device 62, a heater 63, and the controller 50. The cooling device 62 and the heater 63 are in operative response to the thermal sensor 60, via the controller 50, as is described in further detail below. The cooling device 62 aids in thermal energy transfer away from the light source 46. The heater 63 provides and transfers thermal energy into the light source 46. The cooling device 62 and the heater 63 operate to maintain temperature of the light source 46 within a pre-determined temperature range. For example, a diode laser may have a desired temperature operating range of approximately 40°-55° C., where 40° C. may be considered a maximum temperature limit and 55° C. may be considered a minimum temperature limit. These limits may vary as is further described in more detail below. A heat sink 64 is provided and allows thermal energy transfer between the light assembly 42 and the cooling assembly 61. Thermal energy is absorbed by the heat sink 64 from the light assembly 42 and is radiated into the cooling assembly 61.

The thermal sensor 60 is thermally coupled to and senses the temperature of the light source 46 and may be in the form of a thermistor or other temperature-sensing device known in the art. The thermal sensor 60 may be part of the light assembly 42 and located within the light housing 48, as shown, or may be separate from the light assembly 42 or the housing 48. The temperature sensor 60 may be coupled to the heat sink to determine the temperature of the light source.

The cooling device 62 is in thermal communication with the heat sink 64, via an air sleeve 66. The thermal system 11 circulates air around a perimeter 68 of the heat sink 64 and disperses thermal energy from the heat sink 64 into an air gap 70 between a headliner 72 and a roof 74 of the vehicle 14, thereby cooling the heat sink 64 and thus the light assembly 42 and light source 46. The cooling device 62 is utilized in conjunction with the thermal sensor 60 in controlling temperature of the light source 46, when temperature of the light source 46 is above the minimum temperature limit. The minimum temperature limit refers to a minimum temperature as to when the cooling device 62 may be activated.

Although, the cooling device 62 may be in the form of a cooling fan, as shown, the cooling device 62 may be in some other form known in the art. The cooling device 62 may, for example, be in the form of an air-conditioning system or be in the form of a refrigeration type system or circuit having a refrigerant contained therein. As another example, the cooling device 62 may be as simple as an air vent allowing air to circulate and cool the light assembly 42.

The heater 63 may be external to the light source housing 48, as shown, or may be contained within the light source housing 48. The heater 63 is utilized in conjunction with the thermal sensor 60 in controlling temperature of the light source 46, during cold starts of the vehicle 14 or when temperature of the light source 46 is below the maximum temperature limit. The maximum temperature limit refers to a maximum temperature for operation of the heater 63; the heater 63 may be operated at any temperature less than or equal to the maximum temperature limit. The heater 63 increases temperature of the light source 46 in response to a temperature signal generated by the thermal sensor 60.

The controller 50 may be microprocessor based such as a computer having a central processing unit, memory (RAM and/or ROM), and associated input and output buses. The controller 50 may be an application-specific integrated circuit or may be formed of other logic devices known in the art. The controller 50 may be a portion of a central vehicle main control unit, an interactive vehicle dynamics module, a restraints control module, a main safety controller, may be combined into a single integrated controller, a control circuit having a power supply, or may be a stand-alone controller as shown.

The heat sink 64 may be of various size, type, and style known in the art. The heat sink 64 includes a thermal coupler layer 80 that covers a forward surface 82 of the heat sink 64 that resides between the heat sink 64 and the light source 46. The thermal coupler layer 80 provides an efficient thermal transport between the light source 46 and the heat sink 64. The thermal coupler layer 80 may be formed of indium, graphite, or of some other material having similar thermal properties.

By having the thermal system 11 within the illumination system 16, temperature of the light source 46 may be controlled without adjusting temperature within the interior cabin 12.

Figure 4:
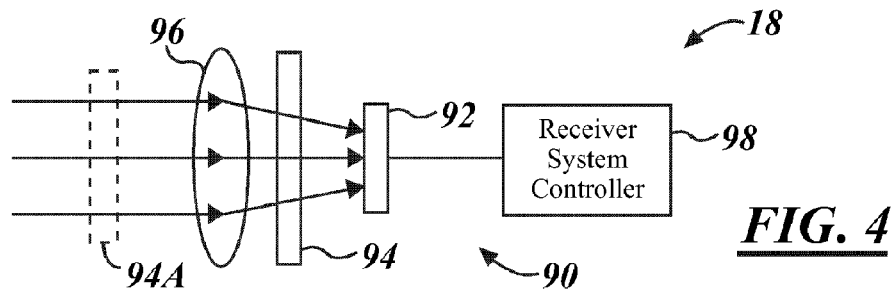
FIG. 4 is a block diagrammatic view of a receiver system in accordance with an embodiment of the present invention.

Referring now to FIG. 4, a block diagrammatic view of a receiver system 18 in accordance with an embodiment of the present invention is shown. The receiver system 18 includes a receiver assembly 90 having a receiver 92, a filter 94, a lens 96, and a receiver system controller 98.

The receiver 92 may be in the form of a charge-coupled device (CCD) camera or a complementary metal oxide semiconductor (CMOS) camera. A CCD camera, Model No. Wat902HS manufactured from Watec America Corporation of Las Vegas, Nev. may, for example, be used as the receiver 92. Near infrared light reflected off objects is received by the receiver 92 to generate an image signal.

The filter 94 is used to filter the reflected near infrared light. The filter 94 may be an optical bandpass filter, which allows light within a near infrared light spectrum to be received by the receiver 92, which may correspond with wavelength of light contained within the illumination signal 20. The filter 94 prevents blooming caused by lights of oncoming vehicles or objects. The filter 94 may be separate from the lens 96 and the receiver 92, as shown, or may be in the form of a coating on the lens 96 or a coating on a lens of the receiver 92, when applicable. The filter may be a multistack optical filter located within the receiver 92.

In an embodiment of the present invention, center wavelength of the filter 94 is approximately equal to emission wavelength of the light source 46 and filter full-width-at-half-maximum is minimized to maximize rejection of ambient light. Also, the filter 94 is positioned between the lens 96 and the receiver 92 to prevent presence of undesirable ghost or false images. When the filter 94 is positioned between the lens 96 and the receiver 92 light received by the lens is incident upon the filter 94 over a range of angles determined by the lens 96.

A filter 94A may also be positioned in front of a lens 96 rather than behind the lens 96 as in the case of filter 94. That is, preferably only one filter is employed (either 94 or 94A).

The receiver controller 98 may also be microprocessor based, be an application-specific integrated circuit, or be formed of other logic devices known in the art. The receiver controller 98 may be a portion of a central vehicle main control unit, an interactive vehicle dynamics module, a restraints control module, a main safety controller, may be combined into a single integrated controller, such as with the illumination controller 50, or may be a stand-alone controller as shown.

Referring again to FIGS. 2-4, the main controller 50 controls operation of the light source 46 and the thermal control system 11 whereas the receiver controller 98 controls operation of the receiver 92. The controllers 50 and 98 may be coupled to vision system controls 100, as are shown in FIG. 2, which are mounted on a center console 102. The system controls 100 may include an activation switch 104, a light coupler position adjuster control 106, and an illumination beam brightness control 108.

The activation switch 104 may be used to activate the vision system 10 manually or the vision system 10 may be internally activated by one of the controllers 50 or 98. The light coupler control 106 may be coupled to a light coupler motor (not shown) for adjusting alignment angles of the light coupler 52 relative to the light source 46 and the optic 54. The brightness control 108 may be used for adjusting illumination beam 20 intensity, which in turn adjusts indication signal brightness or clarity on the indicator 26.

The indicator 26 may include a video system, an audio system, an LED, a light, global positioning system, a heads-up display, a headlight, a taillight, a display system, a telematic system or other indicator known in the art. The indicator 26 may indicate position, range, and traveling speed relative to the vehicle, as well as other known object parameters or characteristics. Objects may include any animate or inanimate objects including pedestrians, vehicles, road signs, lane markers, and other objects known in the art. In one embodiment of the present invention the indicator 26 is in the form of a heads-up display and the indication signal is projected to appear being forward of the vehicle 14. The indicator 26 provides a real-time image of the target area to increase the visibility of objects during relatively low visible light level conditions without having to refocus ones eyes to monitor a display screen within the interior cabin.

Figure 5:
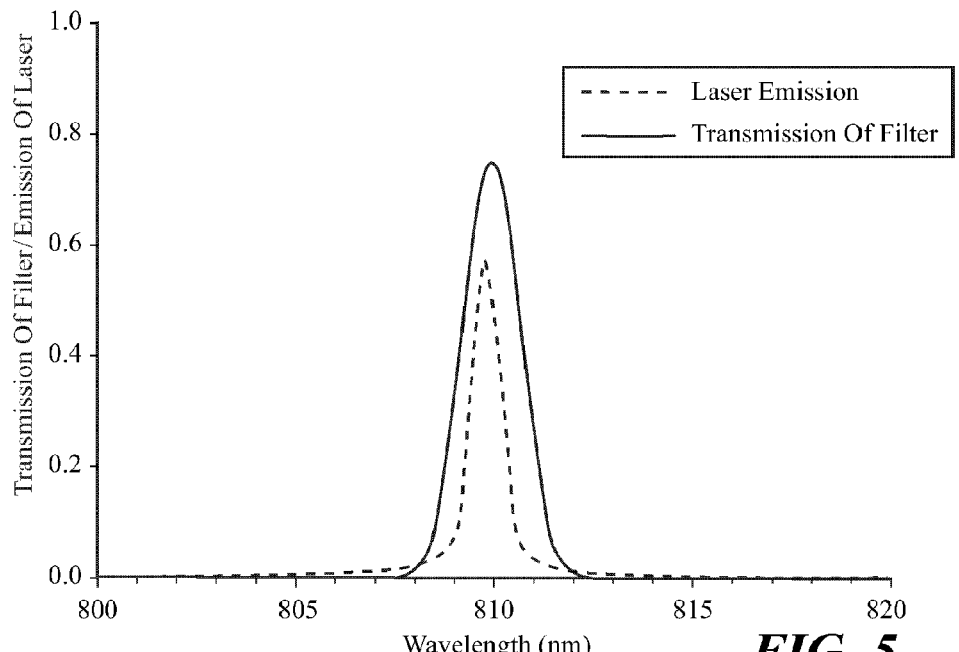
FIG. 5 is a plot of transmission versus wavelength of a filter and light source.

Referring now to FIG. 5, a plot of transmission versus wavelength of a filter is illustrated. The dotted curve shows a typical spectrum of a laser illumination source with full width at half maximum of about 2 nm. The solid black curve shows the transmission profile of a narrow bandpass filter for the case in which its FWHM exceeds that of the laser. As will be described below, by controlling the maximum and minimum temperature set points or by adjusting the center-wavelength of a tunable filter, the overlap between the spectral emission of the laser and the transmission-window of the filter can be maximized. In the case of set points, the wavelength-temperature characteristic of the laser can be used to determine the operating temperature range that will maximize the overlap between the laser emission and filter transmission-window. Another approach is to measure the laser heat-sink temperature, which using the wavelength-temperature characteristic provides information about the emission wavelength. This information can be used to appropriately adjust the center-wavelength of a tunable filter. The filter center-wavelength may need to be increased or decreased as shown in FIG. 5 since the laser spectrum will also increase or decrease. This will be further described below.

Figure 6:
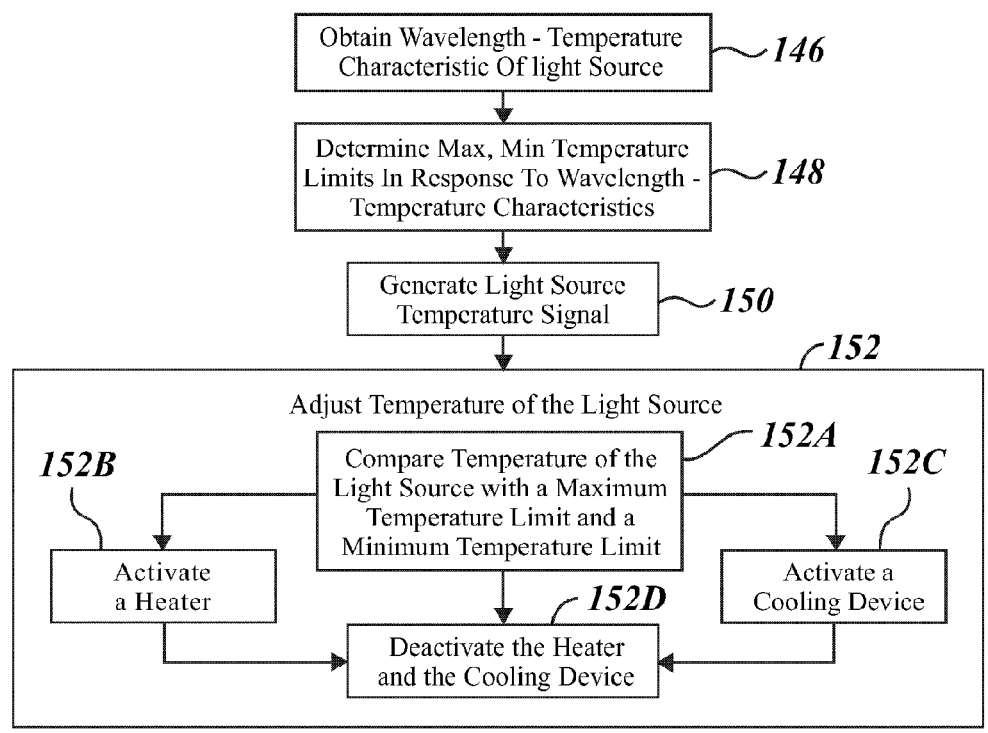
FIG. 6 is a logic flow diagram illustrating a method of thermally controlling operating range of a light source in accordance with an embodiment of the present invention.

Referring now to FIG. 6, a logic flow diagram illustrating a method of thermally controlling operating range of the light source 46 in accordance with an embodiment of the present invention is shown.

In step 146, the wavelength-temperature characteristic or curve of the light source is obtained. The wavelength-characteristic of the light source may be obtained from the manufacturer. In fact, such characteristics are typically provided by the manufacturer of the light source. If this characteristic or curve is not provided, the characteristic may be easily determined in a laboratory-type situation.

In step 148, a maximum and minimum temperature limit may be determined in response to the wavelength-temperature characteristic. The maximum and minimum temperature characteristics will thus vary with respect to the particular light source. Determining the maximum and minimum limits, the wavelength of the light source may be accurately controlled and thus the filter may be provided having a narrow bandwidth of preferably less than 5 nm, more preferably between 5 and 2 nm, and even more preferably about 2 nm or less.

In step 150, the thermal sensor 60 generates a light source temperature signal in response to temperature of the light source 46.

In step 152, the controller 50 adjusts temperature of the light source 46 in response to the light source temperature signal.

In step 152A, the controller 50 compares temperature of the light source with the maximum temperature limit and the minimum temperature limit determined in step 148.

In step 152B, when the temperature of the light source 46 is less than or equal to the maximum temperature limit, the controller 50 activates the heater 63 to increase temperature of the light source 46. The maximum temperature limit using the above sample temperature range of 40°-55° C., may be approximately equal to a temperature range between 40°-42° C. The temperature range between 40°-42° C. may be referred to as a heater deactivation zone. The heater 63 may be activated to increase temperature of the light source 46 even when the vision system 10 is deactivated. By warming the light source 46 before activation of the vision system 10, light source 46 is ready for operation when the vision system 10 is activated, without time delay for ramping up temperature of the light source 46.

In step 152C, when the temperature of the light source 46 is greater than or equal to the minimum temperature limit the controller 50 activates the cooling device 62 to draw thermal energy out and away from the light source 46, in effect cooling the light source 46. For example, the light source 46 may have a preferred operating temperature range of approximately between 40°-55° C., a minimum temperature limit may refer to a temperature in a portion of that temperature range approximately between 52°-55° C., depending upon thermal response time of the system 10. The temperature range between 52°-55° C. may be referred to as a cooling device activation zone. Of course, the ranges may vary based upon the wavelength-temperature characteristic for each light source.

In step 152D, when the temperature of the light source is between the maximum temperature limit and the minimum temperature limit the controller 50 deactivated the heater 63 and the cooling device 62.

When temperature of the light source 46 is greater than or equal to an upper end of the heater deactivation zone the heater 63 is deactivated. For example, the heater deactivation zone may be approximately equal to 40°-42° C., wherein the heater 63 may be deactivated; the upper end may be approximately equal to 42° C.

When temperature of the light source 46 is less than or equal to a lower end of the cooling device activation zone the cooling device 62 is deactivated. For example, the cooling device activation zone may be approximately equal to 52°-55° C., wherein the cooling device 62 may be activated; the lower end may be approximately equal to 52° C.

The above-stated temperatures and temperature ranges, are provided simply for example purposes only and may be adjusted depending upon the application. For example, in another embodiment of the present invention the light source 46 is maintained within an approximate temperature operating range of 35°-55° C.

The present invention maximizes light passage through the filter 94 by maintaining the temperature-operating range of the light source thus maintaining the wavelength-operating range of the light source. By maintaining the wavelength operating range of the light source 46, the present invention minimizes deviations from a filter center wavelength, which can result in reduction of light passing through the filter 94.

The controller 50 in determining operating speeds of the cooling device 62 and thermal output of the heater 63 may use one or more look-up tables containing associated values corresponding to possible light source temperatures.

The controller 50 may ramp up or down rotational speed or thermal output of the cooling device 62 and the heater 63, respectively, upon activation or deactivation thereof. The controller 50 may operate the cooling device 62 and the heater 63 at incremental speeds and thermal outputs or may gradually vary speed and thermal output thereof in response to changes in temperature of the light source 46.

The controller 50, in order to provide increased service life of the cooling device 62, may also adjust the cycle time of the cooling device 62. For example, the cooling device 62 may provide an equivalent amount of cooling by operating the cooling device 62 at a lower speed and for a longer duration as opposed to operating the cooling device 62 at a higher speed and for a shorter duration. In so doing, the present invention minimizes cycle time, or the number of times the cooling device 62 is activated and deactivated within a given period of time.

The controller 50 may determine in certain instances to activate the cooling device 62 or the heater 63 at a maximum speed or maximum thermal output, respectively, in order to provide a maximum amount of cooling or heating. For example, when temperature of the light source 46 increases quickly over a short duration of time the controller 50 may activate the cooling device 62 at a maximum speed to rapidly cool the light source 46. The controller 50 may deactivate the light source 46 when the thermal control system 11 is operating inappropriately to protect the light source 46. When the light source 46 is deactivated the controller 50 may signal a vehicle operator an alarm signal, via the indicator 26.

The above-described steps are meant to be illustrative examples; the steps may be performed sequentially, synchronously, simultaneously, or in a different order depending upon the application.

The present invention provides a thermal control system for a light source of a vision system. The present invention accurately maintains temperature of the light source and thereby also maintains accurate wavelength operating range of the light source. The present invention compensates for changes in ambient temperature of air proximate to the light source in maintaining the wavelength operating range. The present invention minimizes the interior cabin noise caused by the cooling fan, yet provides efficient cooling of the light source.

Compared to the parent application, the present invention allows the wavelength to be maintained within about 2-3 nm of the filter center wavelength rather than in the relatively wide range of about 15 nm.

Figure 7:
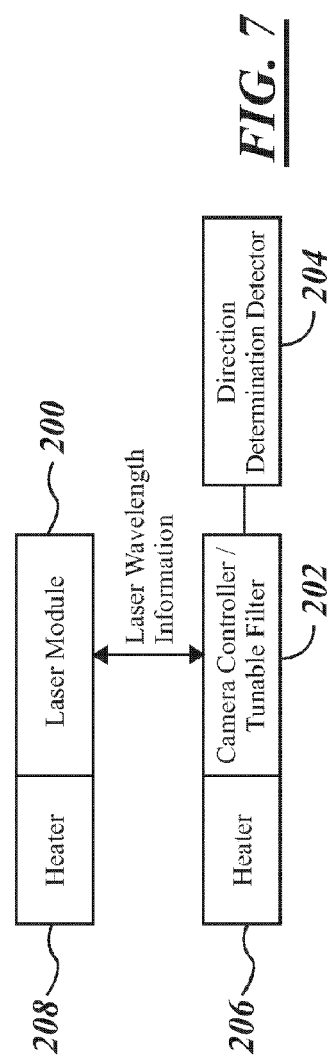
FIG. 7 is a block diagrammatic view of a tunable filter apparatus according to another embodiment of the invention.

Referring now to FIG. 7, a laser module 200 is illustrated coupled to a camera controller/tunable filter 202. The camera controller or tunable filter may also be coupled to a direction determination detector 204. In this embodiment, a tunable filter such as those that have been developed in the telecommunications industry may be tuned by changing its temperature. The tunable filter has an FWHM which is several nanometers and is comparable to the laser spectral width. The laser wavelength may be measured using a spectrum analyzer constructed from a tunable-filter element or inferred from a measurement of the laser heat sink temperature. The laser heat sink temperature as described above may be determined for each of the light sources used in production. The controller may adjust the center wavelength of the tunable filter element. The controller adjusts the center wavelength of the tunable filter such that it matches the center laser wavelength. Thus, as the temperature varies, the tunable filter may be controlled by a heater 206 or other means to maintain the tunable filter center wavelength at the desired location.

A heater or other temperature control device 208 may also be coupled to the laser module or the laser heat sink. If a heater were included in a laser heat sink, a tunable filter-based system would also allow deliberate tuning of the laser to enable glare-free operation of opposing night vision systems. The direction determination detector 204 may provide a signal corresponding to a direction of the vehicle such as north, south, east, west or those in between, to the camera controller and the heaters 206, 208. Based upon the direction of the vehicle, the wavelengths may be tuned. For example, northbound vehicles may be permitted to operate within a certain wavelength band and southbound vehicles assigned another wavelength band that is shifted from the northbound band by an amount greater than the laser spectral width. Likewise, east and westbound vehicles may also be shifted. In fact, many different non-overlapping shifts may be provided for different directions of vehicles. For example, shifts for north, south, east, and westbound vehicles may all be different based upon the output of the direction determination detector 204.

In operation of this embodiment, the laser wavelength may be measured directly or indirectly using a spectral analyzer or inferred from the heat sink temperature. The control module may adjust the temperature or other control means for the tunable filter to move the tunable filter center wavelength (to the longer or shorter wavelengths) to align with the center wavelength of the laser. In another strategy, both the laser center wavelength and the filter center wavelength may be adjusted by controlling the temperature thereon to provide a shift for vehicles heading in different directions. The shift will allow vehicles traveling in different directions to prevent interference of the transmitting beams with the receivers of opposing vehicles.

While the invention has been described in connection with one or more embodiments, it is to be understood that the specific mechanisms and techniques which have been described are merely illustrative of the principles of the invention, numerous modifications may be made to the methods and apparatus described without departing from the spirit and scope of the invention as defined by the appended claims.

What is claimed is:

1. A thermal control system for a light source of a vision system comprising:
   a heater thermally coupled to the light source; and
   a thermal sensor thermally coupled to the light source and generating a temperature signal;
   a controller coupled to said heater and to said thermal sensor, said controller operating said heater when said temperature signal is below a temperature limit, said temperature limit corresponding to a wavelength-temperature curve of the light source.

2. A system as in claim 1 further comprising:
   a cooling assembly having a cooling device and being thermally coupled to the light source; and
   a controller coupled to said cooling assembly and operating said cooling device when said temperature signal is above a minimum temperature limit, said minimum temperature limit corresponding to a wavelength-temperature curve of the light source.

3. A system as in claim 2 wherein said controller activates said cooling device before said temperature signal drifts above said minimum temperate limit.

4. A system as in claim 2 wherein said cooling assembly comprises:
   a cooling fan in thermal communication with said light source;
   said controller operating said cooling fan when said temperature signal is above said minimum temperature limit.

5. A system as in claim 4 wherein said cooling assembly comprises:
   a heat sink thermally coupled to said light source; and
   an air sleeve thermally coupled to said heat sink and said cooling fan;
   said controller operating said cooling fan to circulate air across said heat sink.

6. A system as in claim 5 further comprising a thermal coupler layer thermally coupled between said light source and said heat sink.

7. A system as in claim 2 wherein said controller controls cooling output and activation duration of said cooling device.

8. A system as in claim 1 wherein said heater is activated before said temperature signal drifts below a heater deactivation zone.

9. A system as in claim 1 wherein said controller controls thermal output and duration of said output of said heater.

10. A method of thermally controlling operating range of a light source of a vision system comprising:
    generating a temperature signal in response to temperature of the light source;
    determining a maximum temperature limit in response to a wavelength-temperature characteristic of the light source; and
    heating the light source when said temperature signal is below the maximum temperature limit.

11. A method as in claim 10 further comprising cooling the light source when said temperature signal is above a minimum temperature limit.

* * * * *